US012813129B2

(12) United States Patent
Li

(10) Patent No.: US 12,813,129 B2
(45) Date of Patent: Nov. 24, 2026

(54) LIGHT-EMITTING DEVICE, DISPLAY APPARATUS, AND MANUFACTURING METHOD FOR DISPLAY APPARATUS

(71) Applicant: BOE Technology Group Co., Ltd., Beijing (CN)

(72) Inventor: Guangru Li, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 440 days.

(21) Appl. No.: 18/560,410

(22) PCT Filed: May 24, 2021

(86) PCT No.: PCT/CN2021/095538
§ 371 (c)(1),
(2) Date: Nov. 13, 2023

(87) PCT Pub. No.: WO2022/246604
PCT Pub. Date: Dec. 1, 2022

(65) Prior Publication Data
US 2024/0260389 A1 Aug. 1, 2024

(51) Int. Cl.
*H10K 59/80* (2023.01)
*H10K 59/12* (2023.01)
*H10K 59/122* (2023.01)

(52) U.S. Cl.
CPC ... *H10K 59/80515* (2023.02); *H10K 59/1201* (2023.02); *H10K 59/122* (2023.02)

(58) Field of Classification Search
CPC ......... H10K 59/80515; H10K 59/1201; H10K 59/122
See application file for complete search history.

(56) References Cited

U.S. PATENT DOCUMENTS 6,440,761 B1 * 8/2002 Choi ...................... B82Y 10/00 313/309
2005/0191448 A1 * 9/2005 Suh ...................... H10D 30/675 257/E29.296

(Continued)

FOREIGN PATENT DOCUMENTS

CN 102138365 A 7/2011
CN 102760799 A 10/2012

(Continued)

OTHER PUBLICATIONS

Office Action dated Jul. 11, 2025 for CN202180001238.4 and English Translation.

(Continued)

*Primary Examiner* — Mary Ellen Bowman

(57) ABSTRACT

Provided in the embodiments of the present disclosure are a light-emitting device, a display apparatus, and a manufacturing method for a display apparatus. The light-emitting device comprises: a first electrode layer, which is located on one side of a base substrate; a second electrode layer, which is located on the side of the first electrode layer that faces away from the base substrate; and a light-emitting layer, which is located between the first electrode layer and the second electrode layer, and comprises a plurality of anisotropic nanostructures, wherein the main extension direction of the anisotropic nanostructure is substantially parallel to the base substrate.

14 Claims, 10 Drawing Sheets

(56) References Cited

U.S. PATENT DOCUMENTS

| | | | | |
|---|---|---|---|---|
| 2011/0148286 | A1 | 6/2011 | Ju | |
| 2012/0032138 | A1* | 2/2012 | Kim | H10K 50/115 438/46 |
| 2012/0276669 | A1 | 11/2012 | Wei et al. | |
| 2012/0276670 | A1 | 11/2012 | Wei et al. | |
| 2014/0367721 | A1* | 12/2014 | Mahler | H10H 20/8513 977/773 |
| 2015/0109547 | A1 | 4/2015 | Kim et al. | |
| 2015/0137110 | A1 | 5/2015 | Ahn et al. | |
| 2021/0351247 | A1* | 11/2021 | Hack | H10K 59/70 |
| 2022/0263039 | A1* | 8/2022 | Angioni | H10K 50/15 |
| 2024/0130150 | A1* | 4/2024 | Cheng | H10K 71/60 |

FOREIGN PATENT DOCUMENTS

| | | | |
|---|---|---|---|
| CN | 102760801 | A | 10/2012 |
| CN | 103107065 | A | 5/2013 |
| CN | 104570510 | A | 4/2015 |
| CN | 104737321 | A | 6/2015 |
| CN | 106328009 | A | 1/2017 |
| CN | 106356465 | A | 1/2017 |
| CN | 107331788 | A | 11/2017 |
| CN | 109860440 | A | 6/2019 |
| CN | 110379929 | A | 10/2019 |

OTHER PUBLICATIONS

International Search Report for PCT/CN2021/095538 Mailed Feb. 8, 2022.

Holzner et al., Directed Placement of Gold Nanorods Using a Removable Template for Guided Assembly, Nano Lett. 2011, 11, 3957-3962.

Oh et al., Double-heterojunction nanorod light-responsive LEDs for display applications, Science 355, 616-619 (2017), Feb. 10, 2017.

Kim et al., Electroluminescence emission pattern of organic light-emitting diodes: Implications for device efficiency calculations, Journal of Applied Physics, vol. 88, No. 2, Jul. 15, 2000, pp. 1073-1081.

Nam et al., High Efficiency and Optical Anisotropy in Double-Heterojunction Nanorod Light-Emitting Diodes, ACS Nano, 2015.

Zhang et al., High-efficiency CdSe/CdS nanorod-based red light-emitting diodes, Optics Express 7935, vol. 27, No. 6, Mar. 18, 2019.

Hikmet et al., Polarized-Light-Emitting Quantum-Rod Diodes, Adv. Mater. 2005, 17, 1436-1439.

Amit et al., Semiconductor nanorod layers aligned through mechanical rubbing, Phys. Status Solidi A 209, No. 2, 235-242, 2012, DOI 10.1002/pssa.201127572.

* cited by examiner

LIGHT-EMITTING DEVICE, DISPLAY APPARATUS, AND MANUFACTURING METHOD FOR DISPLAY APPARATUS

CROSS-REFERENCE TO RELATED APPLICATION

The present application is a U.S. National Phase Entry of International Application No. PCT/CN2021/095538 having an international filing date of May 24, 2021. The entire contents of the above-identified application are hereby incorporated by reference.

TECHNICAL FIELD

The present disclosure relates to the technical field of semiconductors, in particular to a light emitting device, a display apparatus, and a manufacturing method of the display apparatus.

BACKGROUND

Due to mismatch of optical constants between a light emitting device and air (a refractive index n of an organic semiconductor is substantially 1.7~ 2.0, a refractive index n of glass is substantially 1.5, and a refractive index n of air is 1), about 70%~ 80% of light in the light emitting device is confined and lost in the device. Through a light output structure such as a micrometer-scale lens array and a grating, light output may be increased by about half, but a cost of these methods is relatively high, and preparation of their structures is also limited by instruments and specific applications.

SUMMARY

Embodiments of the disclosure provide a light emitting device, a display apparatus, and a manufacturing method of the display apparatus. The light emitting device layer includes: a first electrode layer, wherein the first electrode layer is located on a side of the base substrate; a second electrode layer, wherein the second electrode layer is located on a side of the first electrode layer facing away from the base substrate; and an emitting layer, wherein the emitting layer is located between the first electrode layer and the second electrode layer and includes a plurality of anisotropic nanostructures, and a main extension direction of an anisotropic nanostructure is substantially parallel to the base substrate.

In one possible implementation mode, a main body shape of the anisotropic nanostructure includes at least one of a strip shape and a sheet shape; and main extension directions of the plurality of the anisotropic nanostructures are substantially the same.

In one possible implementation mode, it further includes: a first transport layer located between the first electrode layer and the emitting layer; and a second transport layer located between the emitting layer and the second electrode layer.

In one possible implementation mode, there are a plurality of first grooves extending along a first direction on a side of the first transport layer close to the emitting layer, the anisotropic nanostructure is located within a first groove, and the main extension direction of the anisotropic nanostructure is substantially parallel to an extension direction of the first groove.

In one possible implementation mode, there are a plurality of second grooves extending along the first direction on a side of the base substrate close to the first electrode layer, and an orthographic projection of the first groove on the base substrate is located within a second groove.

In one possible implementation mode, an anisotropic nanostructure whose main body shape is a strip shape is selected from one or more of following groups: nanorods, nanowires, nanopillars, nanobelts, and nanobranches.

An embodiment of the present disclosure also provides a display apparatus, which includes a base substrate and a plurality of light emitting devices according to the embodiment of the present disclosure located on the base substrate.

In one possible implementation mode, main extension directions of anisotropic nanostructures in the plurality of light emitting devices are substantially the same.

In one possible implementation mode, the display apparatus further includes a pixel definition layer used for separating the plurality of light emitting devices, and a guide electrode embedded within the pixel definition layer, wherein the guide electrode is configured to form an electric field to guide an arrangement direction of the anisotropic nanostructures when a voltage is applied.

In one possible implementation mode, a vertical distance between the guide electrode and the base substrate is greater than a vertical distance between an emitting layer and the base substrate.

In one possible implementation mode, an orthographic projection of the guide electrode on the base substrate extends along a second direction, and the second direction is substantially perpendicular to a first direction.

In one possible implementation mode, the guide electrode has a plurality of electrode pairs located on opposite sides of a light emitting device; electrode pairs of different light emitting devices are independent from each other; or electrode pairs of light emitting devices in a same row or column are of an integral connection structure.

An embodiment of the present disclosure also provides a manufacturing method of a display apparatus, which includes: providing a base substrate; forming a first electrode layer on a side of the base substrate; forming a first transport layer on a side of the first electrode layer facing away from the base substrate; forming an emitting layer with a plurality of anisotropic nanostructures on a side of the first transport layer facing away from the first electrode layer, wherein a main extension direction of an anisotropic nanostructure is substantially parallel to the base substrate; forming a second transport layer on a side of the emitting layer facing away from the first transport layer; and forming a second electrode layer on a side of the second transport layer facing away from the emitting layer.

In one possible implementation mode, the forming the emitting layer with the plurality of anisotropic nanostructures on the side of the first transport layer facing away from the first electrode layer, includes: forming the emitting layer with the plurality of anisotropic nanostructures on the side of the first transport layer facing away from the first electrode layer through a spin coating or inkjet printing process; and performing a guiding processing on the anisotropic nanostructures of the emitting layer.

In one possible implementation mode, the performing the guiding processing on the anisotropic nanostructures of the emitting layer, includes: performing frictional orientation on the emitting layer through a guide body with fluff to enable main extension directions of the anisotropic nanostructures to be consistent.

In one possible implementation mode, the display apparatus further includes a pixel definition layer located between adjacent light emitting devices; guide electrodes are embedded in pixel definition layers on opposite sides of a light emitting device; and the performing the guiding processing on the anisotropic nanostructures of the emitting layer, includes: guiding the main extension direction of the anisotropic nanostructure through an electric field formed between guide electrodes by applying a voltage to the guide electrodes on both sides of the light emitting device.

In one possible implementation mode, the performing the guiding processing on the anisotropic nanostructures of the emitting layer, includes: pushing the anisotropic nanostructures through airflow and/or air pressure to enable main extension directions of the anisotropic nanostructures to be consistent.

In one possible implementation mode, after providing the base substrate and before forming the first electrode layer on the side of the base substrate, the manufacturing method further includes: forming a plurality of first grooves extending along a first direction on a side of the base substrate facing the first electrode layer, wherein the first direction is substantially the same as the main extension direction of the anisotropic nanostructure.

In one possible implementation mode, the forming the emitting layer with the plurality of anisotropic nanostructures on the side of the first transport layer facing away from the first electrode layer through the spin coating or inkjet printing process includes: forming an ink which contains the anisotropic nanostructure and has a viscosity less than 4 mPa· s; printing the ink on a side of the first transport layer facing away from the first electrode layer through an inkjet printing process to form an emitting thin film layer; and drying the emitting thin film layer at a pressure greater than $10^{-4}$ Torr.

DETAILED DESCRIPTION

In order to make objectives, technical solutions, and advantages of the embodiments of the present disclosure more clear, the technical solutions of the embodiments of the present disclosure will be clearly and completely described below with reference to the drawings of the embodiments of the present disclosure. Apparently, the described embodiments are a part of the embodiments of the present disclosure, not all of the embodiments. Based on the described embodiments of the present disclosure, all other embodiments obtained by those of ordinary skill in the art without creative labor all belong to the protection scope of the present disclosure.

Unless otherwise defined, technical terms or scientific terms used in the present disclosure should have meanings as commonly understood by those of ordinary skill in the art that the present disclosure belongs to. “First”, “second”, and similar terms used in the present disclosure do not indicate any order, quantity, or importance, but are used only for distinguishing different components. “Include”, “contain”, or similar words mean that elements or objects appearing before the words cover elements or objects listed after the words and their equivalents, but do not exclude other elements or objects. “Connect”, “interconnect”, or a similar term is not limited to a physical or mechanical connection, but may include an electrical connection, whether direct or indirect. “Upper”, “lower”, “left”, and “right”, etc., are used for representing relative positional relationships, and when an absolute position of a described object is changed, a relative positional relationship may also be correspondingly changed.

In order to keep following description of the embodiments of the present disclosure clear and concise, detailed description of known functions and known components are omitted in the present disclosure.

Figure 1:
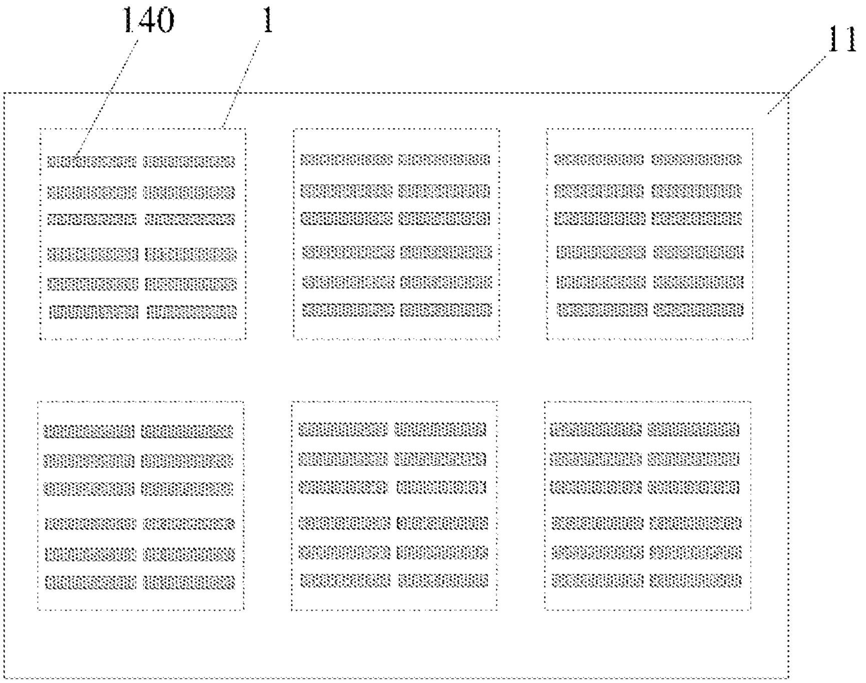
FIG. 1 is a first schematic top view of a display apparatus according to an embodiment of the present disclosure.
Figure 2:
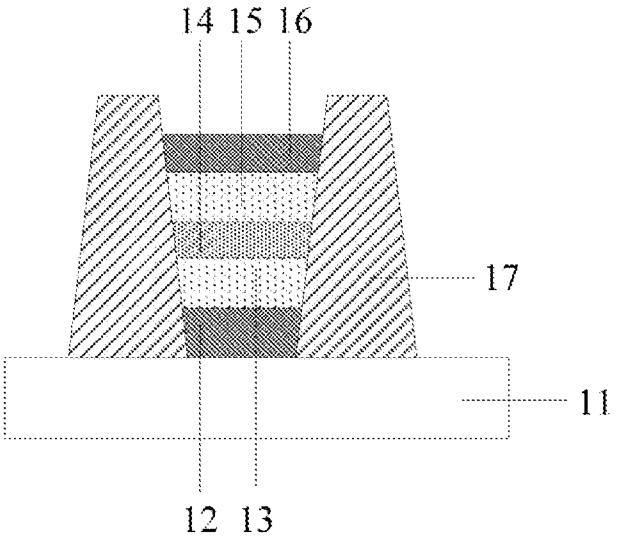
FIG. 2 is a first schematic cross-sectional view of a light emitting device according to an embodiment of the present disclosure.

An embodiment of the present disclosure provides a light emitting device, as shown in FIG. 1 and FIG. 2, including: a first electrode layer 12 located on a side of a base substrate 11; a second electrode layer 16 located on a side of the first electrode layer 12 facing away from the base substrate 11; and an emitting layer 14 located between the first electrode layer 12 and the second electrode layer 16, including a plurality of anisotropic nanostructures 140, wherein a main extension direction of the anisotropic nanostructures 140 is substantially parallel to the base substrate 11.

In an embodiment of the present disclosure, the emitting layer 14 includes a plurality of anisotropic nanostructures 140, wherein a main body shape of an anisotropic nanostructure 140 includes at least one of a strip shape and a sheet shape, a main extension direction of the anisotropic nanostructure 140 is substantially parallel to the base substrate 11, an electrical transition polarization direction of the anisotropic nanostructure 140 is parallel to the main extension direction, and a light output direction is perpendicular to the main extension direction. The main extension direction of the anisotropic nanostructure 140 is substantially parallel to the base substrate 11, so that the anisotropic nanostructure 140 may lie in a plane parallel to the base substrate 11, which thus may improve a light output efficiency of the light emitting device. Compared with quantum dots with random directions, the anisotropic nanostructure lying in the plane may improve the light output efficiency (which may be increased, for example, from $0.75/n^2$ to $1.2/n^2$, wherein n may be a refractive index of a surrounding environment of the emitting layer, may be an effective refractive index, and may be a refractive index of a light emitting material layer or a refractive index of the base substrate according to a specific device structure. If an equivalent refractive index of a light emitting body is considered to be 1.5, the light output efficiency may be improved from 30% to 50%) since its optical polarization direction is in a plane of the device, which is similar to control of a polarization direction of light emitting molecules in an organic semiconductor.

Specifically, the main extension direction of the anisotropic nanostructure 140 is substantially parallel to the base substrate 11, which may be understood as that, for example, if the main extension direction of the nanostructure 140 are within +/−20 degrees of a plane where the base substrate 11 is located, the main extension direction is substantially parallel to the base substrate 11.

It should be noted that FIG. 1 is intended to explain a relationship between the extension direction of the anisotropic nanostructure 140 and the base substrate 11, and other film layers are not shown. In specific implementation, a first electrode layer 12 and a first transport layer 13 may be disposed between the base substrate 11 and the emitting layer 14.

In one possible implementation mode, in combination with FIG. 1 and FIG. 2, the light emitting device may further include a first transport layer 13 located between the first electrode layer 12 and the emitting layer 14, and a second transport layer 15 located between the emitting layer 14 and the second electrode layer 16. Specifically, the first electrode layer 12 may be a cathode, the first transport layer 13 may be an electron transport layer, the second transport layer 15 may specifically be a hole transport layer, and the second electrode layer 16 may specifically be an anode.

The main body shape of the anisotropic nanostructure 140 includes at least one of a strip shape and a sheet shape, and main extension directions of the plurality of anisotropic nanostructures 140 are substantially the same. Specifically, the main extension directions of the plurality of anisotropic nanostructures 140 are substantially the same, which may be understood as that main extension directions of different anisotropic nanostructures 140 differ within a range less than 20 degrees.

Specifically, the light emitting device 1 may be a light emitting device that emits red light, may be a light emitting device that emits blue light, and may be a light emitting device that emits red light. The light emitting device that emits blue light, the light emitting device that emits blue light, and the light emitting device that emits blue light may be arranged periodically in groups of three to achieve display.

In one possible implementation mode, the anisotropic nanostructure whose main body shape is a strip shape may be selected from one or more of following groups: nanorods, nanowires, nanopillars, nanobelts, and nanobranches. The main extension direction of the anisotropic nanostructure whose main body shape is a strip shape may be understood as a direction where a relatively long extension length is located.

Figure 3A:
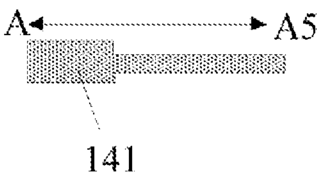
FIG. 3A is a first schematic diagram of an anisotropic nanostructure according to an embodiment of the present disclosure.
Figure 3B:
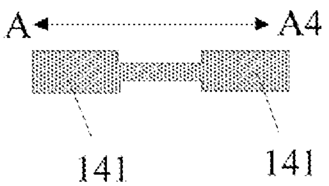
FIG. 3B is a second schematic diagram of an anisotropic nanostructure according to an embodiment of the present disclosure.
Figure 3C:
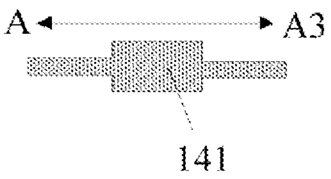
FIG. 3C is a third schematic diagram of an anisotropic nanostructure according to an embodiment of the present disclosure.

An exemplary structure of a nanorod is shown in FIG. 3A, and a strip-shaped nanorod may contain a convex structure 141 which may be located at an end of the nanorod and have a relatively large diameter. If a direction in which an extension length of the nanorod as shown in FIG. 3A is relatively long is indicated by an arrow AA5, a main extension direction thereof may be a direction indicated by the arrow AA5. As shown in FIG. 3B, the convex structure 141 may also be located at both ends of the nanorod at the same time, and a direction in which a relatively long extension length thereof is located is indicated by an arrow AA4, so a main extension direction may be a direction indicated by the arrow AA4. As shown in FIG. 3C, the convex structure 141 may also be located in a middle part of an extension direction of the nanorod, and a direction in which a relatively long extension length thereof is located is indicated by an arrow AA3, so a main extension direction may be a direction indicated by the arrow AA3.

Figure 4:
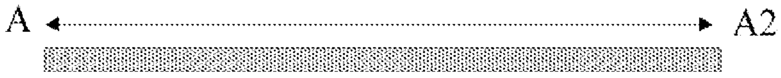
FIG. 4 is a fourth schematic diagram of an anisotropic nanostructure according to an embodiment of the present disclosure.

An exemplary structure of a nanobelt is shown in FIG. 4, and a direction in which a relatively long extension length is located is indicated by an arrow AA2, so a main extension direction may be a direction indicated by the arrow AA2.

Figure 5:
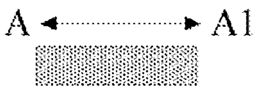
FIG. 5 is a fifth schematic diagram of an anisotropic nanostructure according to an embodiment of the present disclosure.

An exemplary structure of a nanopillar is shown in FIG. 5, and a direction in which relatively long extension length is located is indicated by an arrow AA1, so a main extension direction may be a direction indicated by the arrow AA1.

Figure 6:
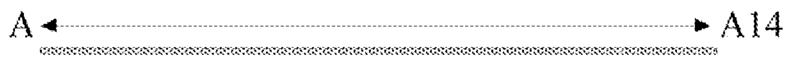
FIG. 6 is a sixth schematic diagram of an anisotropic nanostructure according to an embodiment of the present disclosure.

An exemplary structure of a nanowire is shown in FIG. 6, and a direction in which a relatively long extension length is located is indicated by an arrow AA14, so a main extension direction may be a direction indicated by the arrow AA14.

Figure 7:
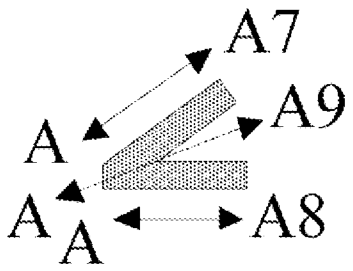
FIG. 7 is a seventh schematic diagram of an anisotropic nanostructure according to an embodiment of the present disclosure.
Figure 8:
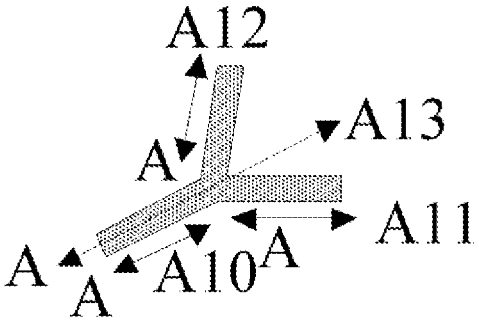
FIG. 8 is an eighth schematic diagram of an anisotropic nanostructure according to an embodiment of the present disclosure.

An exemplary structure of a nanobranch is shown in FIG. 7, the nanobranch has a bifurcated structure, or, as shown in FIG. 8, the nanobranch has a trifurcation structure; for anisotropic nanostructures being a bifurcation structure and a trifurcation structure, if extension lengths in different extension direction are different, a main extension direction thereof may be understood as a direction where a relatively long extension length is located; if the extension lengths in different extension directions are substantially the same, the main extension direction thereof may also be understood as an average orientation of each extension direction. Specifically, for example, an anisotropic nanostructure is a bifurcation structure, as shown in conjunction with FIG. 7, which has two extension directions, one of which is indicated by an arrow AA7 and the other is indicated by an arrow AA8; and a main extension direction of the nano bifurcation may be an average orientation of the two extension directions, as indicated by an arrow AA9. Specifically, for another example, an anisotropic nanostructure is a trifurcation structure, as shown in conjunction with FIG. 8, which has three extension directions, one of which is indicated by an arrow AA10, another extension direction is indicated by an arrow AA11, and another extension direction is indicated by an arrow AA12, and a main extension direction of the nano trifurcation may be an average orientation of the three extension directions, as indicated by an arrow AA13.

Specifically, for a nanowire, a nanopillar, and a nanobelt, if it mainly extends along one direction in a direction perpendicular to an extension direction of a main body, that is, it is a two-dimensional structure, then it may be considered as the nanobelt; if it extends along two directions in the direction perpendicular to the extension direction of the main body, that is, it is a three-dimensional structure, then it may be considered as the nanopillar or the nanowire. Further, for the nanopillar and the nanowire, if a ratio of a length in the extension direction of the main body to an diameter ranges from 1 to 100, it may be considered as the nanopillar; and if the ratio of the length in the extension direction of the main body to the diameter ranges greater than 100, it may be considered as the nanowire.

Figure 9:
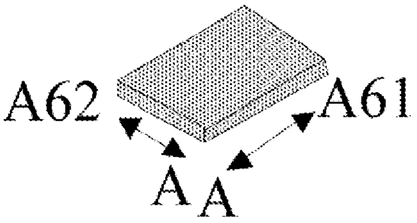
FIG. 9 is a ninth schematic diagram of an anisotropic nanostructure according to an embodiment of the present disclosure.

An anisotropic nanostructure 140 with a sheet shape may include a nanosheet, as shown in FIG. 9, which extends toward two directions, in which one extension direction is indicated by an arrow AA61, and the other extension direction is indicated by an arrow AA62, wherein an extension length in a direction of the arrow AA61 is longer, so the direction indicated by the arrow AA61 may be taken as a main extension direction, and if lengths of the nanosheet in the two extension directions are the same, either extension direction may be taken as the main extension direction.

In one possible implementation mode, as shown in conjunction with FIG. 1, a shape of an anisotropic nanostructure 140 includes a strip shape, and main extension directions of various anisotropic nanostructures 140 of a same light emitting device 1 are substantially the same. Specifically the main extension directions of various anisotropic nanostructures 140 of the same light emitting device 1 are substantially the same, which may be understood as that main extension directions of different anisotropic nanostructures 140 differ within a range less than 20 degrees.

In one possible implementation mode, as shown in conjunction with FIG. 1, main extension directions of anisotropic nanostructures 140 of various light emitting devices 1 are substantially the same. Main extension directions of anisotropic nanostructures 140 of different light emitting devices 1 are substantially the same. Specifically, the main extension directions of the anisotropic nanostructures 140 of the different light emitting devices 1 are substantially the same, which may be understood as that the main extension directions of the anisotropic nanostructures 140 of the different light emitting devices 1 differ within a range less than 20 degrees.

Figure 10:
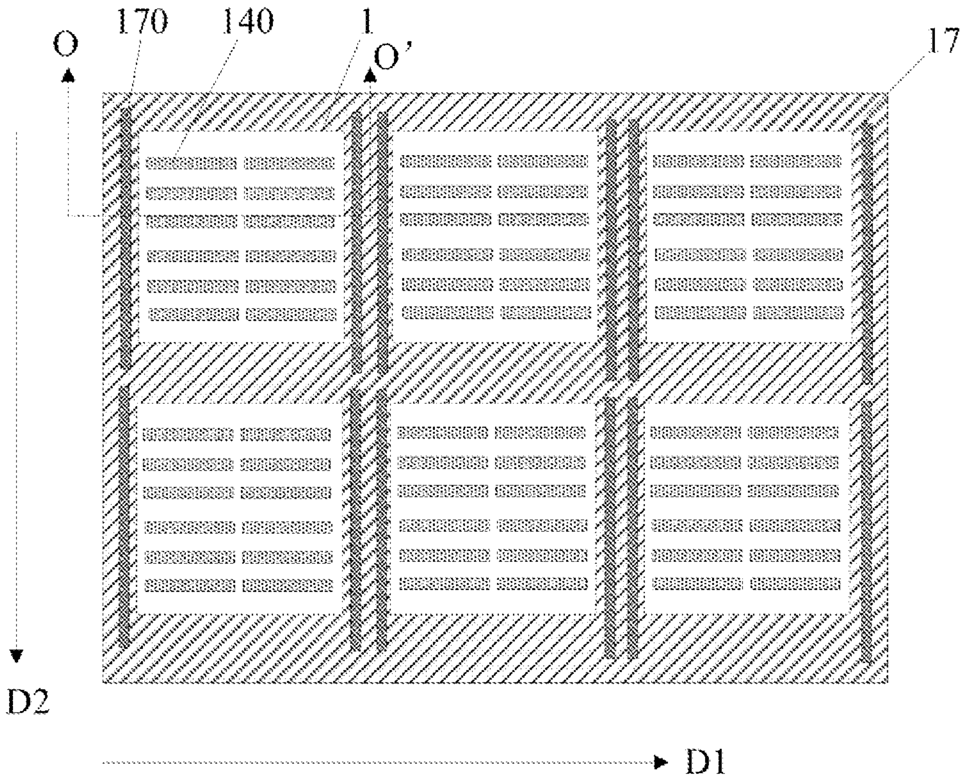
FIG. 10 is a second schematic top view of a display apparatus according to an embodiment of the present disclosure.
Figure 11:
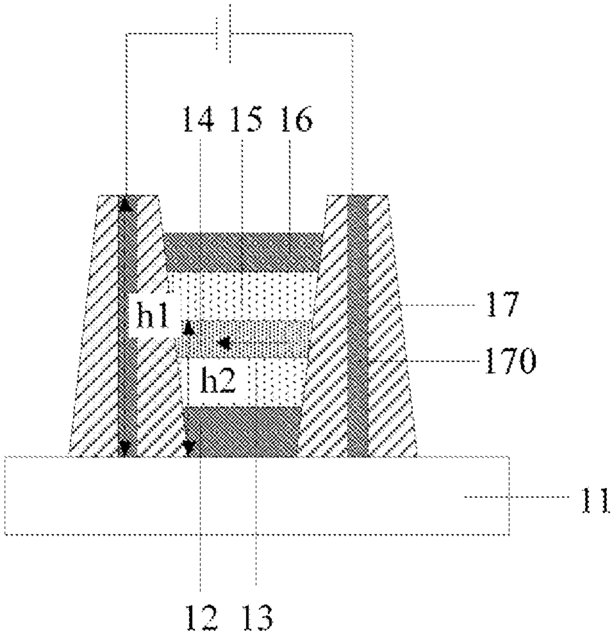
FIG. 11 is a second schematic cross-sectional view of a display apparatus according to an embodiment of the present disclosure.

In one possible implementation mode, referring to FIG. 10 and FIG. 11, wherein FIG. 11 is a schematic cross-sectional view of FIG. 10 along a dotted line OO', and a display apparatus includes a pixel definition layer 17 located between adjacent light emitting devices; and pixel definition layers 17 on opposite sides of the light emitting device 1 are embedded with guide electrodes 170, and a guide electrode 170 is configured to guide an arrangement direction of anisotropic nanostructures 140 through an electric field (a direction indicated by an arrow in FIG. 11) formed by an applied voltage when the anisotropic nanostructures 140 are formed.

In one possible implementation mode, as shown in conjunction with FIG. 10, an orthographic projection of the guide electrode 170 on a base substrate 11 extends along a second direction D2, and the second direction D2 is substantially perpendicular to a first direction D1.

In one possible implementation mode, a vertical distance h1 between the guide electrode 170 and the base substrate 11 is greater than a vertical distance h2 between an emitting layer 14 and the base substrate 11, so that an anisotropic nanostructure 140 is within a region covered by the electric field.

Figure 12:
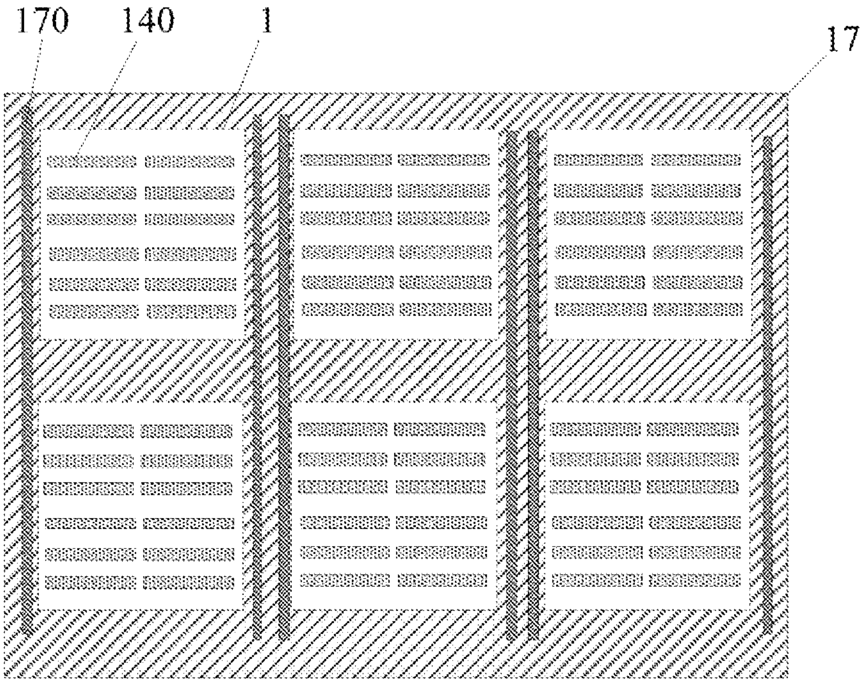
FIG. 12 is a third schematic top view of a display apparatus according to an embodiment of the present disclosure.

In specific implementation, as shown in conjunction with FIG. 10, the guide electrode 170 has a plurality of electrode pairs 171 located on opposite sides of a light emitting device 1; electrode pairs 171 of different light emitting devices 1 are independent from each other and separated from each other, as shown in FIG. 10; or electrode pairs 171 of light emitting devices 1 in a same row or column are of an integral connection structure, as shown in FIG. 12. An extension direction of the guide electrode 170 may be parallel to a column direction of the light emitting device 1 or may be parallel to a row direction of the light emitting device 1.

Figure 13:
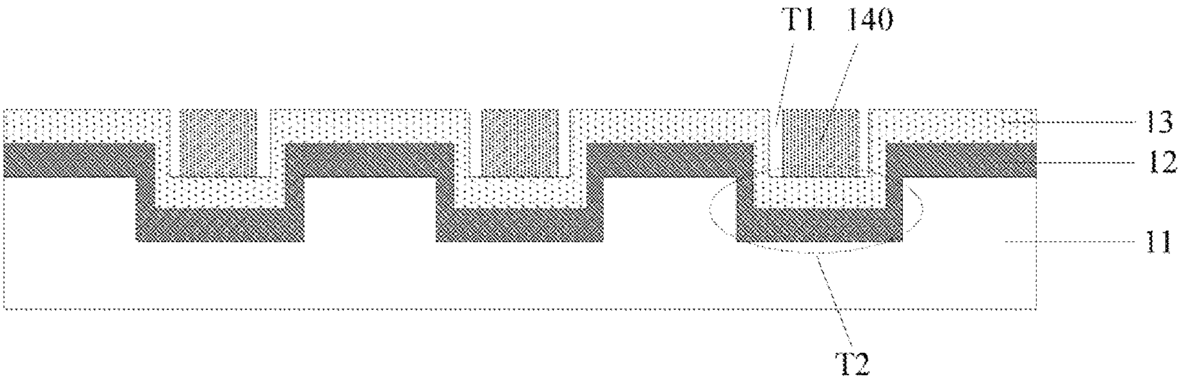
FIG. 13 is a third schematic cross-sectional view of a display apparatus according to an in embodiment of the present disclosure.
Figure 14:
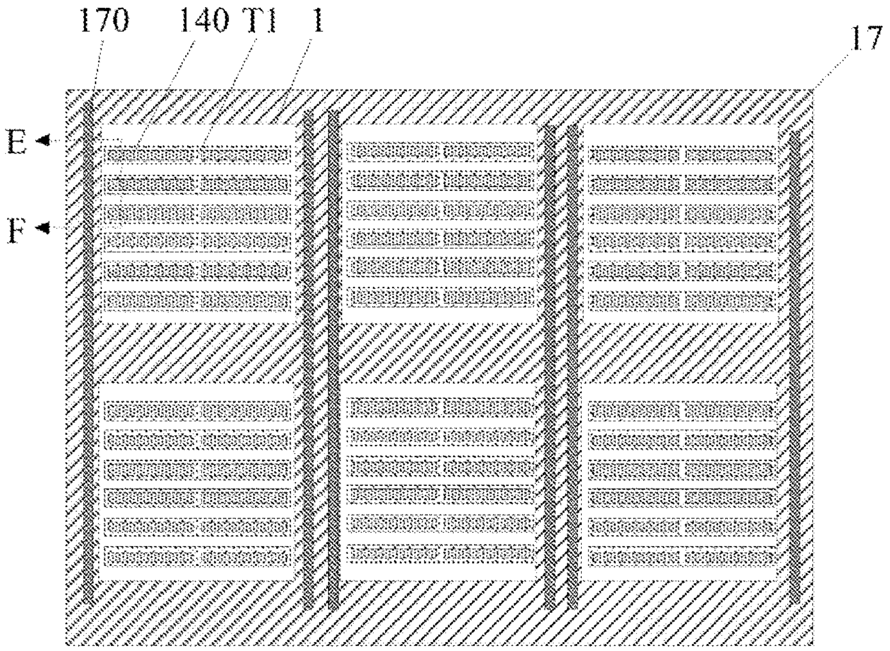
FIG. 14 is a third schematic top view of a display apparatus according to an embodiment of the present disclosure.

In one possible implementation mode, referring to FIG. 13 and FIG. 14, wherein FIG. 13 is a schematic cross-sectional view of a portion of film layers along a dotted line EF in FIG. 14, there are a plurality of first grooves T1 extending along a first direction on a side of the first transport layer 13 facing the emitting layer 14, the anisotropic nanostructure 140 is located within a first groove T1, and a main extension direction of the anisotropic nanostructure 140 is substantially parallel to an extension direction of the first groove T1. Specifically, the main extension direction of the anisotropic nanostructure 140 is substantially parallel to the extension direction of the first groove T1, which may be understood as that extension directions of the two differ within a range less than 20 degrees. In an embodiment of the present disclosure, there are a plurality of first grooves T1 extending along a same direction on a side of the first transport layer 13 facing the emitting layer 14, and an extension direction of the anisotropic nanostructure 140 may be guided when the anisotropic nanostructure 140 is formed, which is beneficial to making extension directions of anisotropic nanostructures 140 consistent.

In one possible implementation mode, as shown in FIG. 13, the base substrate 11 has a second groove T2 in a region corresponding to the first groove T1, and the first electrode layer 12 and the first transport layer 13 have corresponding depressions in a region where the second groove T2 is located to form the first groove T1. In an embodiment of the present disclosure, by forming the second groove T2 on the base substrate 11, a side of the first transport layer 13 facing the emitting layer 14 finally has a plurality of first grooves T1 extending along a same direction, so that formation of the first groove T1 is simple and easy to achieve.

Figure 15:
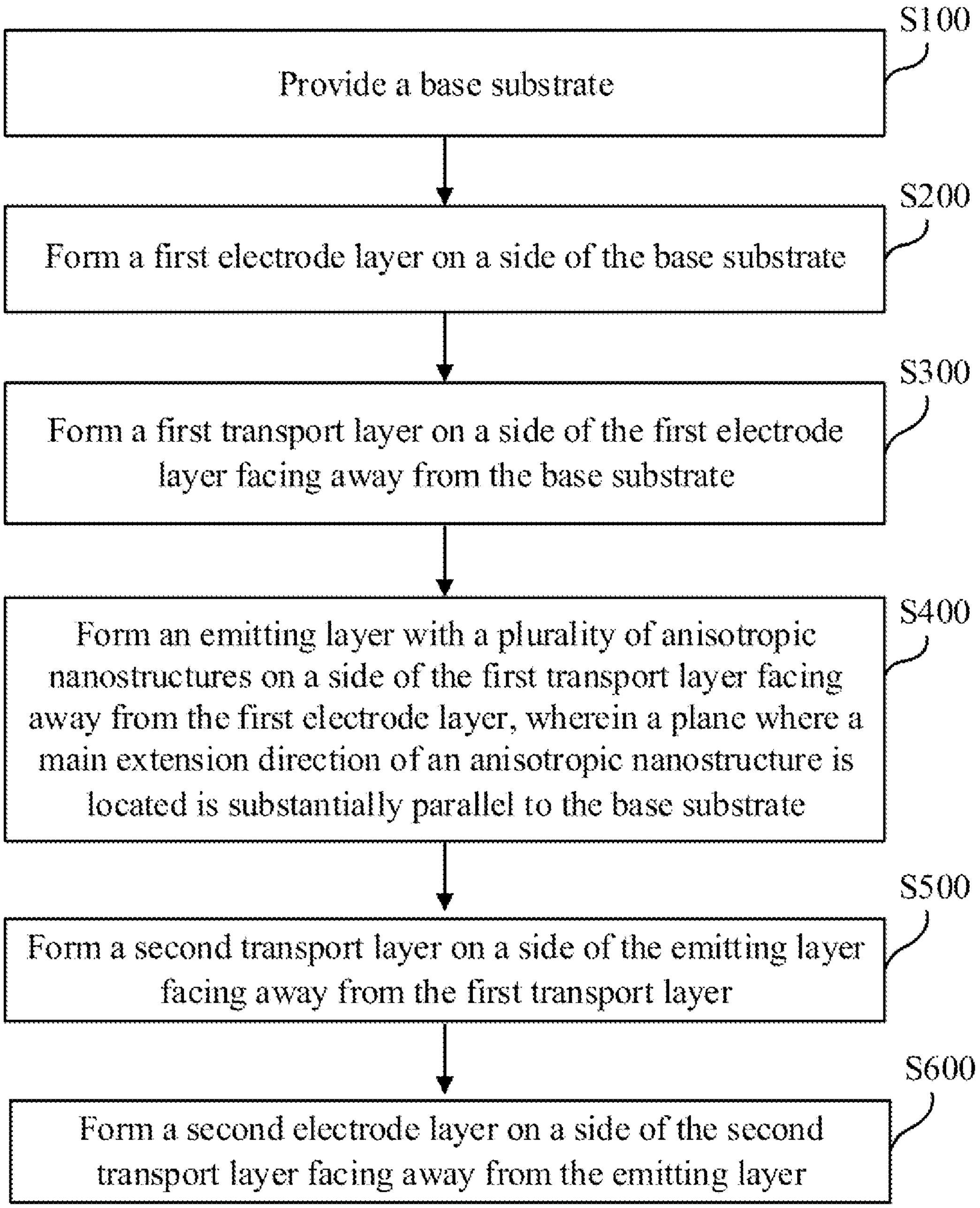
FIG. 15 is a first schematic diagram of a manufacturing flow of a display apparatus according to an embodiment of the present disclosure.

An embodiment of the present disclosure also provides a manufacturing method of a display apparatus, referring to FIG. 15, wherein the method includes following acts.

In act S100, a base substrate is provided.

In act S200, a first electrode layer is formed on a side of the base substrate.

In act S300, a first transport layer is formed on a side of the first electrode layer facing away from the base substrate.

In act S400, an emitting layer with a plurality of anisotropic nanostructures is formed on a side of the first transport layer facing away from the first electrode layer, and a plane where a main extension direction of the anisotropic nanostructures is located is substantially parallel to the base substrate.

In act S500, a second transport layer is formed on a side of the emitting layer facing away from the first transport layer.

In act S600, a second electrode layer is formed on a side of the second transport layer facing away from the emitting layer.

In one possible implementation mode, with respect to the act S400, the emitting layer with the plurality of anisotropic nanostructures is formed on the side of the first transport layer facing away from the first electrode layer, including following acts.

In act S410, the emitting layer with the plurality of anisotropic nanostructures is formed on the side of the first transport layer facing away from the first electrode layer through a spin coating or inkjet printing process.

In act S420, a guiding processing is performed on the anisotropic nanostructures of the emitting layer.

In one possible implementation mode, with respect to the act S420, the guiding processing is performed on the anisotropic nanostructures of the emitting layer, including a following act.

In act S421, a friction orientation is performed on the emitting layer through a guide body with fluff to enable main extension directions of the anisotropic nanostructures to be consistent.

In one possible implementation mode, the display apparatus further includes a pixel definition layer located between adjacent light emitting devices; guide electrodes are embedded in pixel definition layers on opposite sides of a light emitting device; and with respect to the act 420, the guiding processing is performed on the anisotropic nanostructures of the emitting layer, including a following act.

In act S422, a main extension direction of an anisotropic nanostructure is guided through an electric field formed between guide electrodes by applying voltage to the guide electrodes on both sides of the light emitting device.

In one possible implementation mode, with respect to the act S420, the guiding processing is performed on the anisotropic nanostructures of the emitting layer, including a following act.

In act S423, the anisotropic nanostructures are pushed through airflow and/or air pressure to enable main extension directions of the anisotropic nanostructures to be consistent.

Figure 16:
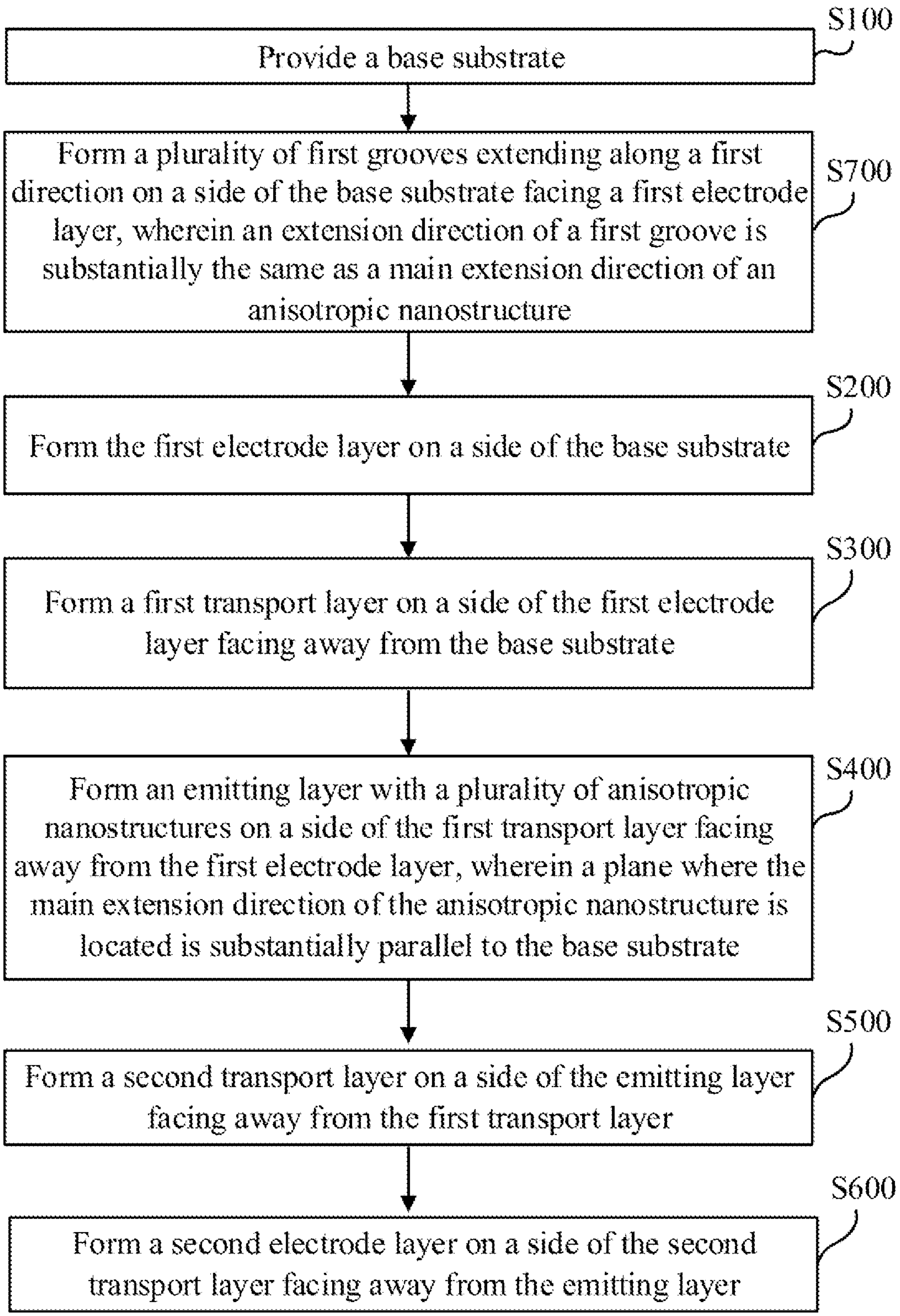
FIG. 16 is a second schematic diagram of a manufacturing flow of a display apparatus according to an embodiment of the present disclosure.

In one possible implementation mode, referring to FIG. 16, after the act S100 and before the act S200, i.e. after providing the base substrate and before forming the first electrode layer on the side of the base substrate, the manufacturing method further includes a following act.

In act S700, a plurality of first grooves extending along a first direction are formed on a side of the base substrate facing the first electrode layer, wherein an extension direction of a first groove is substantially the same as a main extension direction of an anisotropic nanostructure.

In one possible implementation mode, with respect to the act S410, the emitting layer with the plurality of anisotropic nanostructures is formed on the side of the first transport layer facing away from the first electrode layer through the spin coating or inkjet printing process, including: forming liquid which contains an anisotropic nanostructure and has a viscosity less than 4 mPa·s; printing the liquid on a side of the first transport layer facing away from the first electrode layer through an inkjet printing process to form an emitting thin film layer; and drying the emitting thin film layer at a pressure of greater than $10^{-4}$ Torr. In order to more clearly understand the manufacturing method of the display apparatus according to the embodiment of the present disclosure, further description will be made as follows.

Preparation of a first type of device (specifically, which may be, for example, a prototype device without an integrated drive circuit, an electrode area is relatively large and the device is not made into a pixel) includes following acts.

In act 1, a base substrate is provided.

In act 2, a second groove is formed by etching on a side of the base substrate, wherein a width of the second groove in a direction perpendicular to its extension direction may be between 10 nanometers and 1 micron, so that an anisotropic nanostructure (e.g., a nanopillar) may lie flat within the second groove during deposition.

In act 3, a first electrode layer (which may specifically be used as a cathode layer) is formed on a side with the second groove, wherein a material of the first electrode layer may specifically be indium tin oxide.

In act 4, a first transport layer (a bottom transport layer, which may specifically be, an electron transport layer) is deposited and formed on a side of the first electrode layer facing away from the base substrate, and specifically, the first transport layer may be formed in various ways, such as spin coating, evaporation, sputtering, and printing; wherein a material of the first transport layer may include an organic material or may also include an inorganic material.

Specifically, for example, a first mask plate (mask1) is used for sputtering a material of an electron transport layer, herein the material of the electron transport layer is all materials capable of being sputtered, which are selected according to needs, such as ZnO, Zinc Magnesium Oxide (ZnMgO), and Indium Gallium Zinc Oxide (IGZO).

In act 5, an emitting layer is deposited.

Specifically, deposition of a nano light emitting material: an anisotropic nanostructure may be a nanopillar, a nanobelt, a nanorod, a nanosheet, a nanobranch, and a multi-branched nanostructure, a scale of which is greater than 1 nm and less than 500 nm in the longest direction; main extension directions (long end directions) of most anisotropic nanostructures are parallel to a plane of the base substrate through an improved deposition method; when printing in pixel pits, a proportion of solvent in the solution is controlled and a vacuumizing rate is improved; for example, when printing, a solvent with viscosity less than 4 mPa·s is used, and when drying under a reduced pressure, a pressure greater than $10^{-4}$ Torr is used.

For example, three special methods may achieve better guided deposition.

Figure 17:
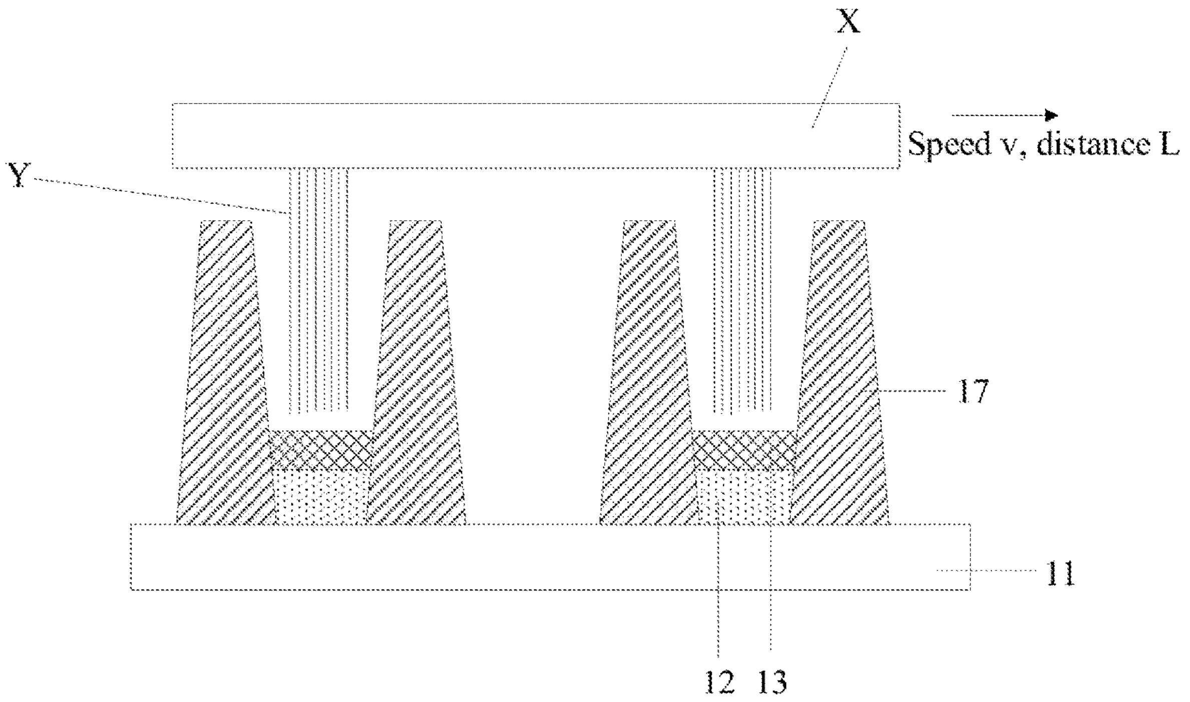
FIG. 17 is a first schematic diagram of guiding an anisotropic nanostructure according to an embodiment of the present disclosure.

(a) Referring to FIG. 17, a guide body X with fluff Y and a length longer than 500 nm is adopted, so that the fluff Y can touch a bottom of a pixel pit, flexibility of the guide body X (rubbing material, such as cloth) is moderate, a pressure of 1 kg/cm$^2$ is applied, a speed is 0~1 m/s, and a distance is 0~ 1 m, and one-way rubbing is performed and may be released, and then it is returned to continue, so as to strengthen a rubbing effect.

Figure 18:
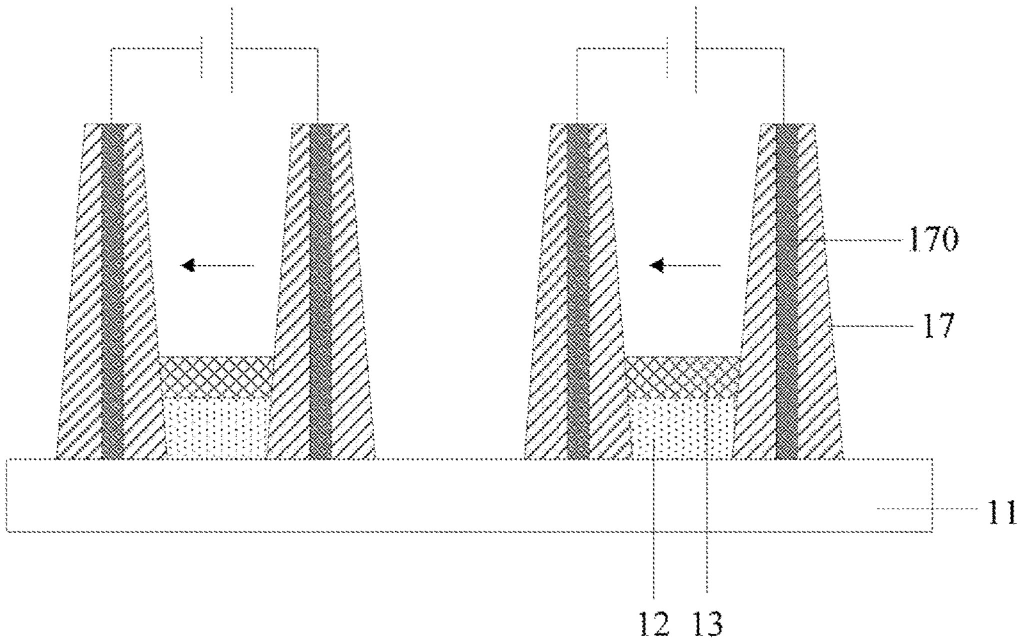
FIG. 18 is a second schematic diagram of guiding an anisotropic nanostructure according to an embodiment of the present disclosure.

(b) Referring to FIG. 18, a pair of guide electrodes 170 are deposited in the pixel definition layer 17 or the base substrate 11, and before, during, or after printing, or all of the time, a strong transverse electric field is applied in the pixel pit through the guide electrode 170, wherein an electric field intensity is 0~10 MV/cm, and a current limiting mode may be adopted for an application circuit of the electric field to avoid partial breakdown and damage to a device.

Figure 19:
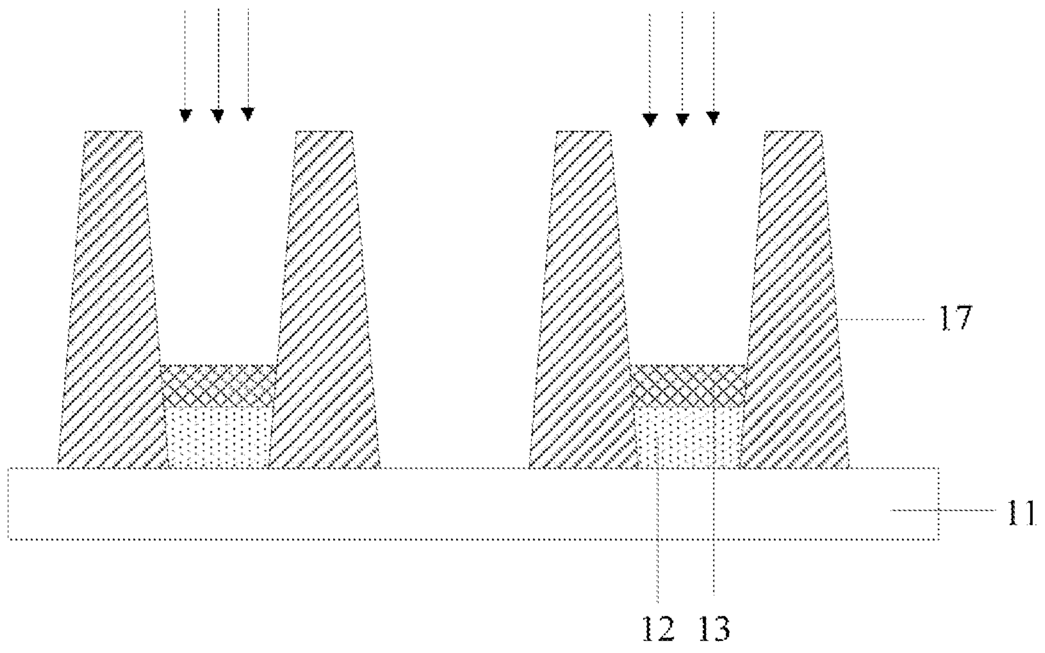
FIG. 19 is a third schematic diagram of guiding an anisotropic nanostructure according to an embodiment of the present disclosure.

(c) Referring to FIG. 19, an anisotropic nanostructure in the emitting layer is pushed by using air flow and air pressure, in a direction indicated by an arrow in FIG. 19, a pressure is 0~ 1 Torr; and there are three specific application methods: (1) directly blowing air to a surface of the base substrate 11, (2) blowing a low-pressure gas to a surface of the base substrate 11 in a low-pressure environment, which can more finely control a force of the gas, (3) alternately vacuumizing first to, such as $10^{-5}$ Torr, then releasing vacuum and applying pressure to the base substrate by using a pressure difference between the two times.

In act 6, a second transport layer (a top transport layer) is deposited, and the second transport layer may be formed in various ways, such as spin coating, evaporation, sputtering, and printing; wherein a material of the second transport layer may include an organic material or may also include an inorganic material.

Specifically, for example, a solution in toluene with a Poly [(9,9-di-n-octyl fluorenyl-2,7-diyl)-alt-(4,4'-(N-(4-n-butyl) phenyl)-diphenylamine)] (TFB) content of 10 wt % is spin coated at a speed of 3000 rpm.

In act 7, a second electrode layer (a top electrode) is deposited, and the second electrode layer may be formed in various ways, such as evaporation, spin coating, and printing; and specifically, for example, an Ag electrode is evaporated as a second electrode layer.

Preparation of a second type of device (specifically, which may be, for example, a device including a pixel point) forms a display array, and the manufacturing method may include following acts.

In act 1, a first electrode layer and a first transport layer are deposited in a pixel pit defined by a pixel definition layer.

In act 2, an anisotropic nanostructure is deposited, and an inkjet printing method may be used for performing arrangement guidance in deposition or during deposition.

In act 3, a second transport layer and a second electrode layer are deposited, wherein materials of the second transport layer and the second electrode layer may be the same as that of a prototype device, the second transport layer may be formed by means of inkjet printing or evaporation, and the second electrode layer may be formed by means of evaporation.

In an embodiment of the present disclosure, the emitting layer 14 includes a plurality of anisotropic nanostructures 140, wherein a main body shape of an anisotropic nanostructure 140 includes at least one of a strip shape and a sheet shape, a main extension direction of the anisotropic nanostructure 140 is substantially parallel to the base substrate 11, an electrical transition polarization direction of the anisotropic nanostructure 140 is in the main extension direction, and a light output direction is perpendicular to the main extension direction. The main extension direction of the anisotropic nanostructure 140 is substantially parallel to the base substrate 11, so that the anisotropic nanostructure 140 may lie in a plane parallel to the base substrate 11, thus a light output efficiency of a light emitting device may be improved.

Although preferred embodiments of the present disclosure have been described, those skilled in the art may make additional changes and modifications to these embodiments once underlying creative concepts are known. Therefore, the appended claims are intended to be interpreted to encompass preferred embodiments as well as all changes and modifications falling within the scope of the present disclosure.

Apparently, those skilled in the art may make various modifications and variations to the embodiments of the present disclosure without departing from the spirit and scope of the embodiments of the present disclosure. Thus, if these modifications and variations to the embodiments of the present disclosure are within the scope of the claims of the present disclosure and their equivalent techniques, the present disclosure is also intended to include these modifications and variations.

The invention claimed is:

1. A light emitting device, comprising:

a first electrode layer, wherein the first electrode layer is located on a side of the base substrate;

a second electrode layer, wherein the second electrode layer is located on a side of the first electrode layer facing away from the base substrate; and an emitting layer, wherein the emitting layer is located between the first electrode layer and the second electrode layer and comprises a plurality of anisotropic nanostructures, and a main extension direction of an anisotropic nanostructure is substantially parallel to the base substrate, wherein light emitting device further comprises:

a first transport layer located between the first electrode layer and the emitting layer; and a second transport layer located between the emitting layer and the second electrode layer; and wherein there are a plurality of first grooves extending along a first direction on a side of the first transport layer close to the emitting layer, the anisotropic nanostructure is located within a first groove, and the main extension direction of the anisotropic nanostructure is substantially parallel to an extension direction of the first groove.

2. The light emitting device according to claim 1, wherein a main body shape of the anisotropic nanostructure comprises at least one of a strip shape and a sheet shape; and main extension directions of the plurality of the anisotropic nanostructures are substantially the same.

3. The light emitting device according to claim 1, wherein there are a plurality of second grooves extending along the first direction on a side of the base substrate close to the first electrode layer, and an orthographic projection of the first groove on the base substrate is located within a second groove.

4. The light emitting device according to claim 1, wherein an anisotropic nanostructure whose main body shape is a strip shape is selected from one or more of following groups: nanorods, nanowires, nanopillars, nanobelts, and nanobranches.

5. A display apparatus, comprising a base substrate and a plurality of light emitting devices according to claim 1 located on the base substrate.

6. The display apparatus according to claim 5, wherein main extension directions of anisotropic nanostructures in the plurality of the light emitting devices are substantially the same.

7. The display apparatus according to claim 5, wherein the display apparatus further comprises a pixel definition layer used for separating the plurality of light emitting devices, and a guide electrode embedded within the pixel definition layer, wherein the guide electrode is configured to form an electric field to guide an arrangement direction of the anisotropic nanostructures when a voltage is applied.

8. The display apparatus according to claim 7, wherein a vertical distance between the guide electrode and the base substrate is greater than a vertical distance between an emitting layer and the base substrate.

9. The display apparatus according to claim 7, wherein an orthographic projection of the guide electrode on the base substrate extends along a second direction, and the second direction is substantially perpendicular to a first direction.

10. The display apparatus according to claim 7, wherein the guide electrode has a plurality of electrode pairs located on opposite sides of a light emitting device; electrode pairs of different light emitting devices are independent from each other; or electrode pairs of light emitting devices in a same row or column are of an integral connection structure.

11. A manufacturing method of a display apparatus, comprising:

providing a base substrate;

forming a first electrode layer on a side of the base substrate;

forming a first transport layer on a side of the first electrode layer facing away from the base substrate;

forming an emitting layer with a plurality of anisotropic nanostructures on a side of the first transport layer facing away from the first electrode layer, wherein a main extension direction of an anisotropic nanostructure is substantially parallel to the base substrate;

forming a second transport layer on a side of the emitting layer facing away from the first transport layer; and forming a second electrode layer on a side of the second transport layer facing away from the emitting layer wherein the forming the emitting layer with the plurality of anisotropic nanostructures on the side of the first transport layer facing away from the first electrode layer comprises:

forming the emitting layer with the plurality of anisotropic nanostructures on the side of the first transport layer facing away from the first electrode layer through a spin coating or inkjet printing process; and performing a guiding processing on the anisotropic nanostructures of the emitting layer; and wherein the performing the guiding processing on the anisotropic nanostructures of the emitting layer comprises: performing frictional orientation on the emitting layer through a guide body with fluff to enable main extension directions of the anisotropic nanostructures to be consistent; or wherein the display apparatus further comprises a pixel definition layer located between adjacent light emitting devices; guide electrodes are embedded in pixel definition layers on opposite sides of a light emitting device; and the performing the guiding processing on the anisotropic nanostructures of the emitting layer comprises:

guiding the main extension direction of the anisotropic nanostructure through an electric field formed between guide electrodes by applying a voltage to the guide electrodes on both sides of the light emitting device; or wherein the performing the guiding processing on the anisotropic nanostructures of the emitting layer comprises: pushing the anisotropic nanostructures through airflow and/or air pressure to enable main extension directions of the anisotropic nanostructure to be consistent.

12. The manufacturing method according to claim 11, wherein after providing the base substrate and before forming the first electrode layer on the side of the base substrate, the manufacturing method further comprises:

forming a plurality of first grooves extending along a first direction on a side of the base substrate facing the first electrode layer, wherein the first direction is substantially the same as the main extension direction of the anisotropic nanostructure.

13. The manufacturing method according to claim 12, wherein the forming the emitting layer with the plurality of anisotropic nanostructures on the side of the first transport layer facing away from the first electrode layer through the spin coating or inkjet printing process, comprises:

forming an ink which contains the anisotropic nanostructure and has a viscosity less than 4 mPa·s;

printing the ink on a side of the first transport layer facing away from the first electrode layer through an inkjet printing process to form an emitting thin film layer; and drying the emitting thin film layer at a pressure greater than $10^{-4}$ Torr.

14. The light emitting device according to claim 2, wherein an anisotropic nanostructure whose main body shape is a strip shape is selected from one or more of following groups: nanorods, nanowires, nanopillars, nanobelts, and nanobranches.

* * * * *